United States Patent
Tanaka

(10) Patent No.: US 6,779,148 B2
(45) Date of Patent: Aug. 17, 2004

(54) ERROR DETECTION AND CORRECTION METHOD IN A COMPUTER SYSTEM AND MAIN MEMORY CONTROLLER OF THE SAME

(75) Inventor: Tsuyoshi Tanaka, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 409 days.

(21) Appl. No.: 09/805,169

(22) Filed: Mar. 14, 2001

(65) Prior Publication Data

US 2001/0025359 A1 Sep. 27, 2001

(30) Foreign Application Priority Data

Mar. 14, 2000 (JP) .......................................... 2000-070824

(51) Int. Cl.$^7$ ................................................. G06F 11/00
(52) U.S. Cl. ........................................................ 714/753
(58) Field of Search ................................. 714/753, 755, 714/763, 764; 360/26, 53

(56) References Cited

U.S. PATENT DOCUMENTS 5,459,742 A * 10/1995 Cassidy et al. ............. 714/763
6,003,144 A * 12/1999 Olarig et al. ................. 714/42

FOREIGN PATENT DOCUMENTS

JP    689196    3/1994

OTHER PUBLICATIONS

Error–Control Coding for Computer System, Chapter 4, pp. 138–140, Chapter 5, pp. 280–284.

* cited by examiner

Primary Examiner—Albert Decady
Assistant Examiner—Shelly A Chase
(74) Attorney, Agent, or Firm—Antonelli, Terry, Stout & Kraus, LLP

(57) ABSTRACT

According to an error detection and correction method to be implemented in a computer system, when an error is detected in data to be written in a memory, fault information is appended to the data without an increase in the number of bits constituting the data, and the resultant data is stored in the memory. An error control code represented by a SEC-DEC code is adopted for encoding and decoding. Data is encoded into a shortened code. At this time, specific bit positions associated with column vectors deleted from a parity check matrix defined in the error control code are allocated to fault information. Thus, a word to be actually stored in the memory is composed of check bits produced from data to be written and fault information, and information bits constituting the data to be written. Decoding is performed on the assumption that the fault information represents 0s. When data having fault information appended thereto is decoded, the fault information is reproduced through error detection and correction.

9 Claims, 14 Drawing Sheets

FAULT INFORMATION | INFORMATION BITS | CHECK BITS $D = [e_0\ e_1\ d_0\ d_1\ c_0\ c_1\ c_2\ c_3]$ (1) FAULT INFORMATION IS [00]
    $D = [\underline{0\ 0}\ d_0\ d_1\ c_0\ c_1\ c_2\ c_3]$ (2) FAULT INFORMATION IS [10] OR [01]
    $D = [\underline{1\ 0}\ d_0\ d_1\ c_0\ c_1\ c_2\ c_3]$
    OR
    $D = [\underline{0\ 1}\ d_0\ d_1\ c_0\ c_1\ c_2\ c_3]$

FAULT INFORMATION IS [00]

FIG. 6
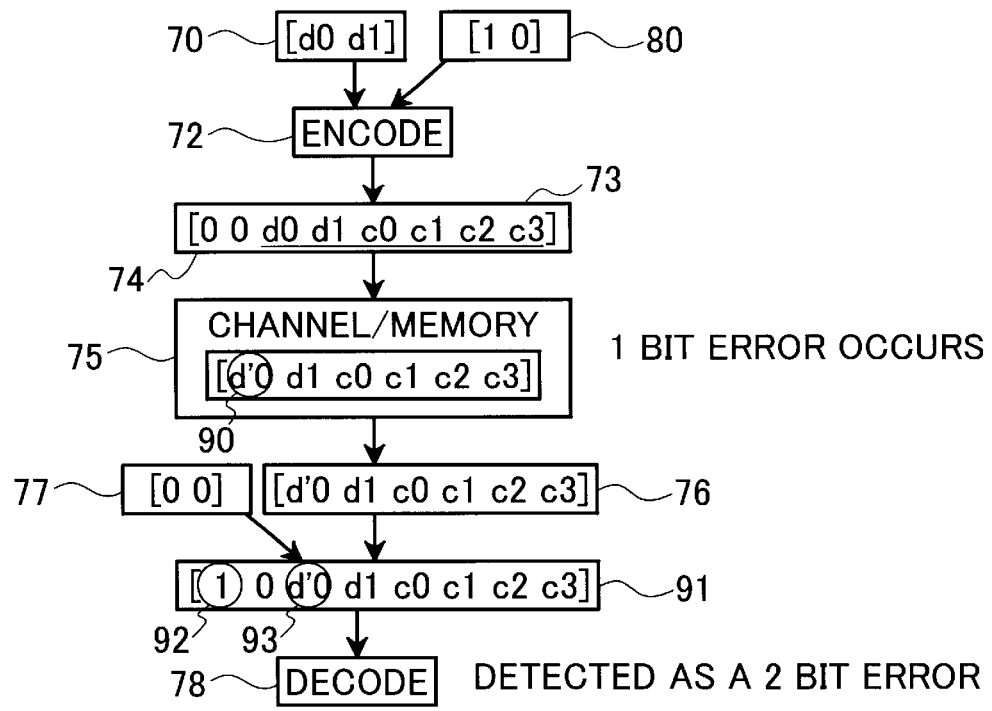
FIG. 7A
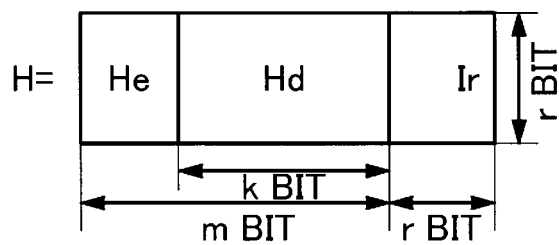
FIG. 7B
$D=[e_0, e_1, \cdots, e_{m-k-1}, d_0, d_1, \cdots, d_{k-1}, c_0, c_1, \cdots, c_{r-1}]$

FIG. 9

| POSITION ON H MATRIX | PATTERN OF SYNDROME | KIND OF FAULT |
|---|---|---|
| e0 | [1 1 0 0 0 0 0 1] | UNCORRECTABLE ERROR IN CPU BUS |
| e1 | [1 1 0 0 0 0 1 0] | UNCORRECTABLE ERROR IN IO BUS 0 |
| e2 | [0 0 0 1 1 1 0 0] | UNCORRECTABLE ERROR IN IO BUS 1 |
| e3 | [0 0 1 0 1 1 0 0] | UNCORRECTABLE ERROR FROM CROSSBAR SWITCH |

FIG. 16

PRIOR ART

EXAMPLE OF (8,4)SEC-DED CODE $$H = \begin{bmatrix} d_0 & d_1 & d_2 & d_3 & c_0 & c_1 & c_2 & c_3 \\ 1 & 1 & 1 & 0 & 1 & 0 & 0 & 0 \\ 1 & 1 & 0 & 1 & 0 & 1 & 0 & 0 \\ 1 & 0 & 1 & 1 & 0 & 0 & 1 & 0 \\ 0 & 1 & 1 & 1 & 0 & 0 & 0 & 1 \end{bmatrix} = [h_0 \ h_1 \ h_3 \ h_4 \ h_5 \ h_6 \ h_7]$$

(INFORMATION BITS: $d_0 d_1 d_2 d_3$; CHECK BITS: $c_0 c_1 c_2 c_3$)

FIG. 17

PRIOR ART

EXAMPLE OF 2bit ERROR : ERROR OCCURS IN $d_0$ AND $d_1$ $$S = h_0 + h_7 = \begin{bmatrix} 1 \\ 1 \\ 1 \\ 0 \end{bmatrix} + \begin{bmatrix} 1 \\ 1 \\ 1 \\ 0 \end{bmatrix} = \begin{bmatrix} 1 \\ 1 \\ 1 \\ 0 \end{bmatrix}$$

FIG. 18

PRIOR ART

EXAMPLE OF ERROR : 1 BIT ERROR OCCURS IN
MISCORRECTION      A CODE WORD HAVING
                   CHECK BITS OF ALL "1"

(1) DATA D FROM WHICH SYNDROME APPEARS ALL "1"

INFORMATION   CHECK
   BITS       BITS

D=[0 0 0 0 1 1 1 1]

(2) DATA D' IN CASE 1 BIT ERROR OCCURS IN DATA D

D'=D+[0 0 0 0 0 0 0 1] = [0 0 0 0 1 1 1 0]

(3) SYNDROME S" GENERATED FROM D'

$$S'=D'H^T = \begin{bmatrix} 1 \\ 1 \\ 0 \\ 0 \end{bmatrix} = h0$$

CHECK BIT d0 IS MISCORRECTED INTO D", BECAUSE
THE SYNDROME COINCIDENT TO THAT OF DATA
HAVING 1 BIT ERROR IN d0.

D"=[0 0 0 0 1 1 1 1]

ERROR DETECTION AND CORRECTION METHOD IN A COMPUTER SYSTEM AND MAIN MEMORY CONTROLLER OF THE SAME

BACKGROUND OF THE INVENTION

The present invention relates to a method of detecting a failure of a computer system, and to a main memory controller of computer systems. In particular, this invention relates to a technology that is effectively applied to an error detection and correction method, a main memory controller for computer systems, and a computer system preferably used to avoid a system failure derived from occurrence of an error and to specify an error source.

As a method of avoiding a system failure, when an uncorrectable error is detected in data to be written in a main memory over a CPU bus or an I/O bus, for example, Japanese Patent Laid-open No. 6-89196 has disclosed an approach described below. Namely, when a main memory controller detects an uncorrectable error in data transferred over a CPU bus or an I/O bus, certain received data is rewritten into data having a specific pattern. Check bits produced from the specific pattern data are all inverted. Consequently, data having all inverted check bits and being encoded according to a specific error correcting code is written in a main memory. When the data is read from the main memory, if a calculated syndrome exhibits an all-1 bit and the data has the specific pattern, the received data is judged as data struck with an uncorrectable error over the CPU bus or I/O bus. Consequently, fault information can be recorded without increasing the number of interface signals used to provide an interface with the main memory and needed to store fault information, and increasing the storage capacity of the main memory.

Moreover, in case where a fault recovery means for retrying an instruction transferred over a CPU bus or an I/O bus is not included, when a fault is detected, re-booting is not performed. Only when a CPU attempts to read the above-mentioned data, an interrupt is issued to the CPU in order to report that a fault has been detected. Even when fault-stricken data is written in the main memory, as long as the CPU does not attempt to read the data, the fault in the data can avoid a system failure (a system halt, re-booting, or any other failures directly recognized by a user). This contributes to improvement of system availability.

The present inventor has discussed aforesaid methods of constructing the code proposed in the prior art. Consequently, three drawbacks described below have become apparent. Namely, these drawbacks are that (1) when check bits are inverted, a syndrome calculated for received data exhibits an all-1 bit pattern and, consequently, has a multi-bit error pattern whose occurrence frequency is low; (2) if another one-bit error occurs in the main memory, the data encoded according to the specific error correcting code may be wrongly corrected; (3) since the data is rewritten to have a specific pattern, the original pattern of the data cannot be referenced. These drawbacks will be further described by taking examples.

To begin with, the drawbacks (1) and (2) will be described by taking introductory remarks. For brief sake, a single-bit error correcting/double-bit error detecting code (SEC-DED code) will be taken for instance. The SEC-DED code is defined, as shown in FIG. 16, such that a code length is eight bits and a check bit length is four bits. For a description of the code, refer to "Error-Control Coding for Computer Systems" (P.140) written by T. R. N. Rao and E. Fujiwara.

FIG. 16 shows an example of a parity-check matrix H (hereinafter, matrix H) and an example of arrangement of information bits and check bits. Each of the column vectors of the matrix H is referred to as h0, h1, . . . , h7. FIG. 17 implies an example of the drawback (1). Assuming that a two-bit error occurs to involve bit positions d0 and c3 shown in FIG. 16, as a syndrome S an all-1 bit pattern is produced. Depending on a way of constructing a code, even if a syndrome produced exhibits an all-1 bit pattern, a multi-bit whose occurrence frequency is low is not detected as an error.

Referring to FIG. 18, the drawback (2) will be described. As shown in (1) of FIG. 18, an encoded word is [00000000], check bits are all inverted according to the conventional method, whereby data d=[00001111] is produced. Thereafter, a one-bit error occurs as shown in (2) of FIG. 18. The data struck with the error is [00001110]. A syndrome for the data is, as shown in (3) of FIG. 18, calculated using the matrix H shown in FIG. 16. The syndrome corresponds to the column vector h0 in the matrix H shown in FIG. 16. Consequently, it is judged that a one-bit error has occurred at the bit position d0. Eventually, the data is wrongly corrected into [10001110].

When the conventional method is adapted to an error control code generally implemented in computer systems, the drawbacks (1) and (2) may arise. Therefore, the conventional method cannot be applied to all error control codes but can be applied to the error control code that employs the matrix H of a specific bit pattern. However, the related art does not refer to what kind of code is applied to.

Next, the drawback (3) will be described below. Several patterns of data in which an error was detected were inspected. Consequently, data whose specific bit is struck with a stuck-at-zero error may be produced. If the patterns of such fault-stricken data are kept, they may help to analyze cause of the error. Therefore, if the patterns of fault-stricken data are discarded, it takes much time to analyze the cause of the error, thereby causing a Mean-Time-To-Repair (MTTR) to increase.

SUMMARY OF THE INVENTION

An object of the present invention is to provide an error detection and correction method be capable of encoding data so as to keep, as fault information, a detected result of uncorrectable error in an input data without changing the number of bits constituting the encoded word, and storing the resultant data in a main memory. Moreover, this method can avoid such a situation that the data is wrongly corrected in decoding the encoded data because of a failure to reproduce the fault information.

Another object of the present invention is to provide an error detection and correction method that does not discard the pattern of fault-stricken data and not hinder analysis of cause of an error.

Still another object of the present invention is to provide an error detection and correction method making it possible to accomplish the above objects without greatly modifying a known encoding circuit or decoding circuit.

These and other objects of the present invention and novel features thereof will be apparent from the description of this specification and the appended drawings.

The representative aspects of the present invention disclosed in this specification will be briefed below.

To begin with, the gist of the present invention will be described using the error control code described in conjunction with FIG. 16. The SEC-DED code implied in FIG. 16 is defined such that a code length is eight bits and an information bit length is four bits. The SEC-DED code may be referred to as (8, 4) SEC-DED code. Hereafter, the maximum code length in the SEC-DED code, in which the number of check bits is four, is known to being eight bits as described in page 139 of the above-mentioned literature. When the number of information bits that must be protected by an error control code is 2, column vectors associated with bit positions unallocated to information bits are deleted from the matrix H as shown in FIG. 1, by the number of unused bits in the information bits. A SEC-DED code employing the resultant matrix is therefore a (6, 2) SEC-DED code. When data is encoded with the bit positions of necessary information bits alone associated with column vectors of the matrix H, a removed code is referred to as a shortened code. The underlying idea of the present invention is that fault information is allocated to the bit positions associated with the deleted column vectors.

In an example shown in FIG. 2, bits of fault information e0 and e1 are allocated to the bit positions associated with the deleted column vectors. FIG. 3(1) and FIG. 3(2) show how bits are arranged in an encoded word. Normally, when data is encoded without fault information appended thereto, 0s (zeros) are arranged as fault information as shown in FIG. 3(1). FIG. 4 describes an encoding and decoding procedure. Data 70 to be encoded and fault information 71 indicating whether the data 70 is struck with an error are encoded using the matrix H that is defined in the (8, 4) SEC-DED code described in conjunction with FIG. 2. Encoding means to produce check bits c0, c1, c2, and c3 in practice. The fault information is removed from a encoded code 73 produced, and the remaining bits [d0 d1 c0 c1 c2 c3] alone are transmitted over a communication line or to a memory 75. Data 76 received over the communication line or from the memory 75 is decoded by using the matrix H which is defined in the (8, 4) SEC-DED code described in conjunction with FIG. 2, on the assumption that the fault information represents fixed bits of [0 0]. Data 79 is obtained by decoding 78 the encoded data 78. Decoding means to produce a syndrome from a encoded word received, decode the syndrome, and invert a bit position at which an error has occurred. What is important herein is that fault information is not transmitted over a communication line or to a memory. Namely, data 70 received from a transmitting side is decoded at a receiving side, on the assumption that the data is always struck with no error.

When fault information is appended to data, the fault information is, as shown in FIG. 3(2), allocated to a bit position e0 or e1. As shown in FIG. 5, data produced by giving fault information 80 to bit positions e0 and e1, is encoded 72. Received data is decoded on the assumption that the fault information represents 00. Therefore, a leading one bit is judged to be an error. Consequently, data 81, in which the fault information is reproduced, is obtained by the decoding 78. However, as long as the code employed in this example is adopted, each bit allocated at both the bit positions e0 and e1 can never be 1. This is because, as the error correcting capacity of the employed code is one bit, information of only one bit at most can be reproduced. By adopting a code having a more powerful error-correcting capacity than the SEC-DED code, the amount of fault information that can be transferred at one time can be increased. When a shortened code is employed, as mentioned above, if the fault information is appended to the shortened code, the aforesaid drawback (1) can be solved. In this case, a data pattern attained, before being encoded, is kept as it is. Normally, although employed code lengths are 32 bits, 64 bits, or 128 bits. the numbers of check bits permitted by the SEC-DED code relative to the code lengths are 7 bits, 8 bits, or 9 bits, respectively. Maximum lengths of the information bits permitted by the SEC-DED code relative to the numbers of check bits are 57 bits, 120 bits, or 247 bits, respectively. In either case, since the shortened code is employed, the method in accordance with the present invention can be used normally.

Further, FIG. 6 shows that the drawback (2) can be solved. Referring to FIG. 6, if data 70 is encoded (72) together with fault information 80, and part 90 of the data transferred over a communication line or to a memory 75 becomes an error, then received data 91 to be decoded is struck with an error at two bit positions 92 and 93. The error corresponds to a two-bit error and, therefore, it is possible to detect such error.

A generalized example of the above case will be described in conjunction with FIG. 7A and FIG. 7B. In FIG. 7A and FIG. 7B, there are shown a matrix He having a size ((m−k)×r), a matrix Hd having a size (k×r), and a unit matrix Ir having a size (r×r). (He, Hd) is associated with information bit positions, while the matrix Ir is associated with check bit positions. The matrix His assumed to have a maximum code length of m+r bits comprising a maximum information bit length of m bits and a check bit length of r bits; t (t>0) bit error correcting codes; and u (u>t) bit error detecting codes. Incidentally, in claims 1 to 8, t is replaced with c and u is replaced with d. Herein, if the information bit length employed is k (m>k>0) bits, fault information of min (t, m−k) bits at most can be encoded. At this time, min (a, b)=a at a≦b and min (a, b)=b at a≧b. Furthermore, even if data having the fault information appended thereto is struck with an error of u−min(t, m−k) bits over a communication line or in a memory, the fault-stricken data is not wrongly corrected. FIG. 7B shows a data position in an encoded word by using the matrix H shown in FIG. 7A. Fault information is allocated to m−k bit positions e0, e1, . . . , e(m−k−1). Information bits are allocated to k bit positions d0, d1, . . . , d(k−1). Check bits are allocated to r bit positions c0, c1, . . . , c(r−1). However, the allocation of bits can be modified by switching bit positions to such an extent that the nature of the code is not altered. The present invention provides an error detecting and correcting means characterized by the coding system described in conjunction with FIG. 7A and FIG. 7B.

Moreover, there is provided an error detecting and correcting means that makes the most of the fact that the sum of encoded words is an encoded word. Namely, when data to be transferred over a communication line or to a memory is encoded according to an error control code, data to be encoded and used for arithmetic operations by a CPU is not integrated with fault information of the data in order to produce check bits. Instead, an existing data encoding means is separated from a fault information encoding means. Check bits produced for the data and check bits produced for the fault information are linearly added to each other and then encoded.

Moreover, the objects of the present invention can be solved by using a computer system described below. The system consists mainly of processors, a main memory, a main memory controller, an I/O unit, a processor bus, a memory bus, and an I/O bus. The main memory controller stores data encoded according to an error control code. A plurality of processors is connected to the main memory controller over the processor bus. The main memory is connected to the main memory controller over the memory bus. The I/O unit is connected to the main memory controller over the I/O bus. When the main memory controller is connected to another main memory controller, the main memory controller included in the computer system is provided with a crossbar switch input/output control unit used to connect the main memory controller to a crossbar switch. In this case, the main memory controller includes a circuit for detecting an error in data on the processor bus, a circuit for detecting an error on the I/O bus, a circuit for detecting an error in data transferred from the crossbar switch, data written into the main memory, an encoder circuit, a decoding circuit, and a fault information detection table. The encoder circuit produces check bits from information indicating that an uncorrectable error is detected in data transferred over the processor bus and written in the main memory, or information indicating that an uncorrectable error has been detected in data transferred over the I/O bus and written in the main memory. The decoding circuit produces a syndrome for data read from the main memory, and detects and corrects an error according to the bit pattern of the syndrome. The fault information detection table makes the detection of whether the bit pattern of the syndrome produced by the decoding circuit is a specified pattern, in order to identify the source of an uncorrectable error that has occurred before encoding performed by the encoder circuit.

BRIEF DESCRIPTION OF THE DRAWINGS

FIG. 6 is a flowchart showing an example of a processing flow (when fault information exists and an error occurs in data transferred over a communication line or to a memory) defined by the method proposed in the present invention.

FIG. 7A is an explanatory diagram concerning a coding system proposed in the present invention.

FIG. 7B is an explanatory diagram concerning a coding system proposed in the present invention.

FIG. 9 is an explanatory diagram showing a relational table between fault information and a bit pattern of a syndrome which is an embodiment of the present invention.

FIG. 16 is an explanatory diagram showing an example of a code for explaining drawbacks of a prior art.

FIG. 17 is an explanatory diagram showing an example (a two-bit error) for explaining drawbacks of a prior art.

FIG. 18 is an explanatory diagram showing an example (wrong correction) for explaining drawbacks of a prior art.

DESCRIPTION OF THE PREFERRED EMBODIMENTS

Figure 1:
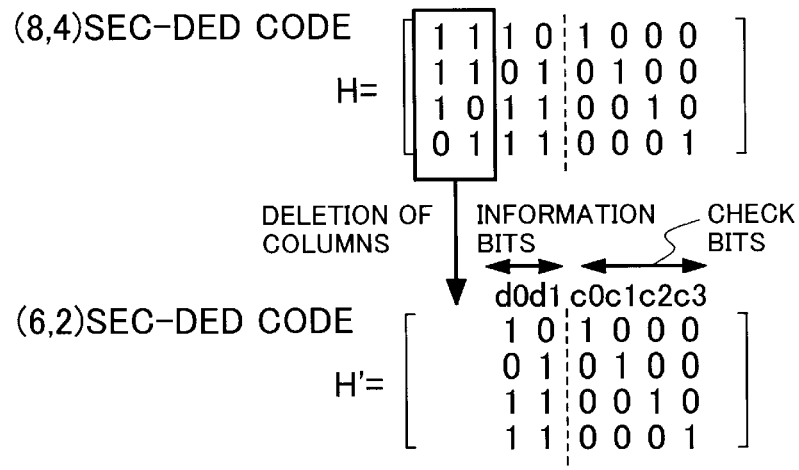
FIG. 1 is an explanatory diagram showing an example of a code for introducing the underlying idea of a method proposed in the present invention.
Figure 2:
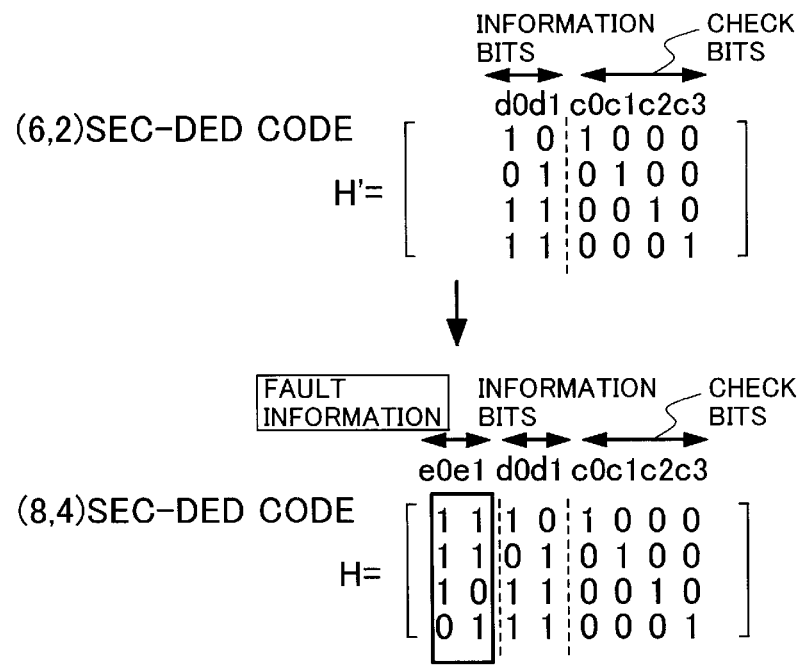
FIG. 2 is an explanatory diagram showing the underlying idea of the method proposed in the present invention.
Figures 3, 4:
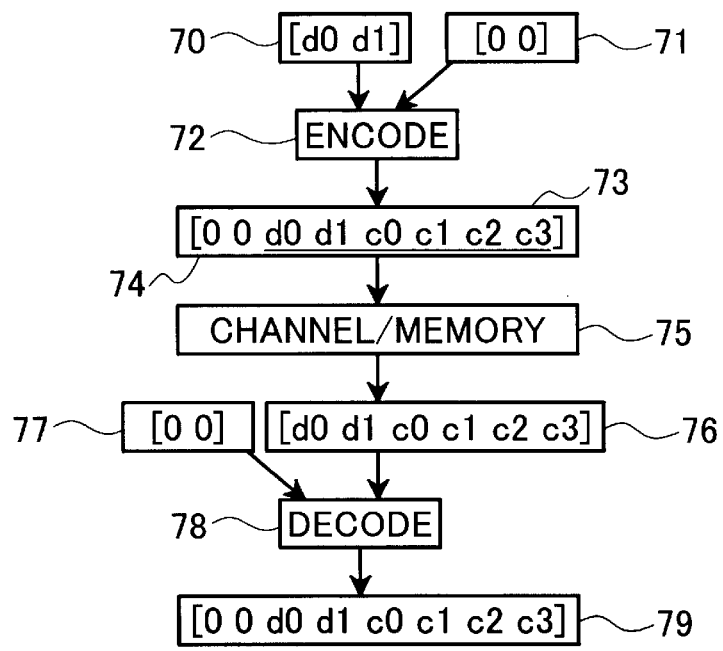
FIG. 3 is an explanatory diagram showing a data structure defined by the method proposed in the present invention.
FIG. 4 is a flowchart showing an example of a processing flow (when no error exists) defined by the method proposed in the present invention.
Figure 5:
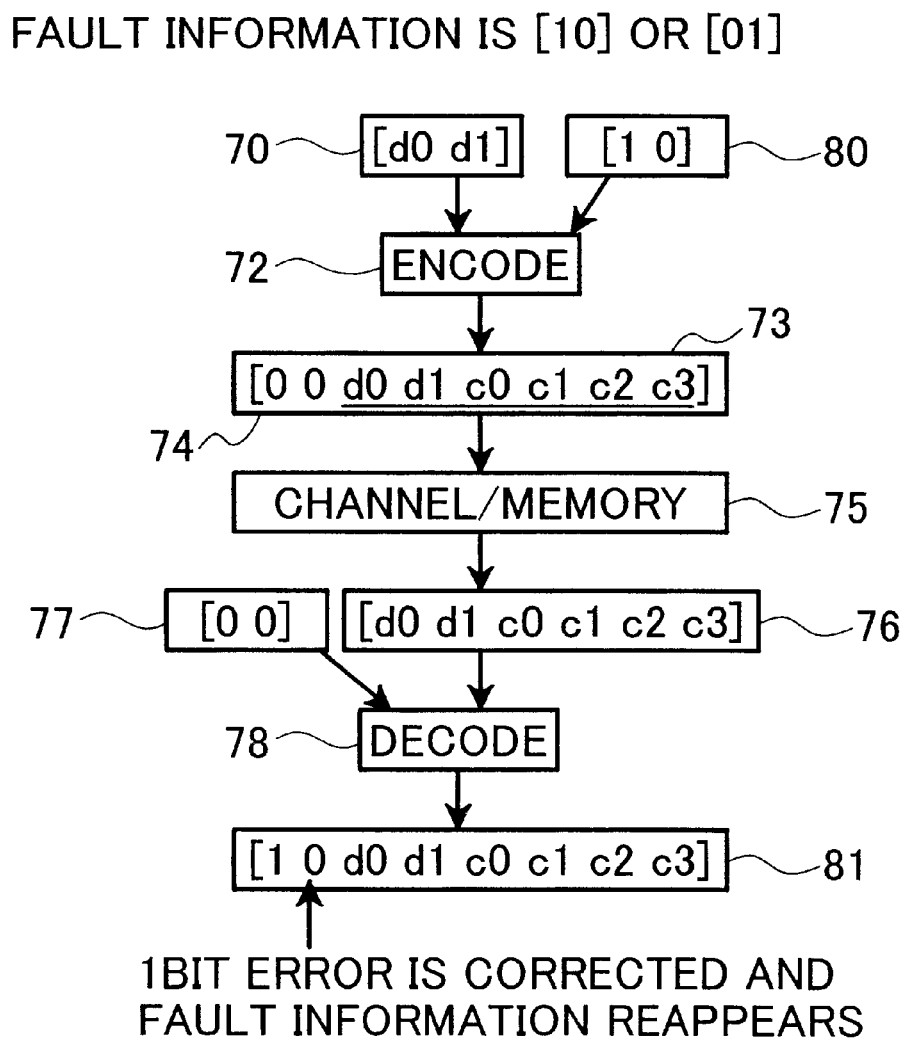
FIG. 5 is a flowchart showing an example of a processing flow (when fault information exists) defined by the method proposed in the present invention.

An embodiment of the present invention will be described in conjunction with the drawings. In all the drawings, the same reference numerals are denoted by the same members. Reiteration of explanations of the same members will be omitted.

Figure 8:
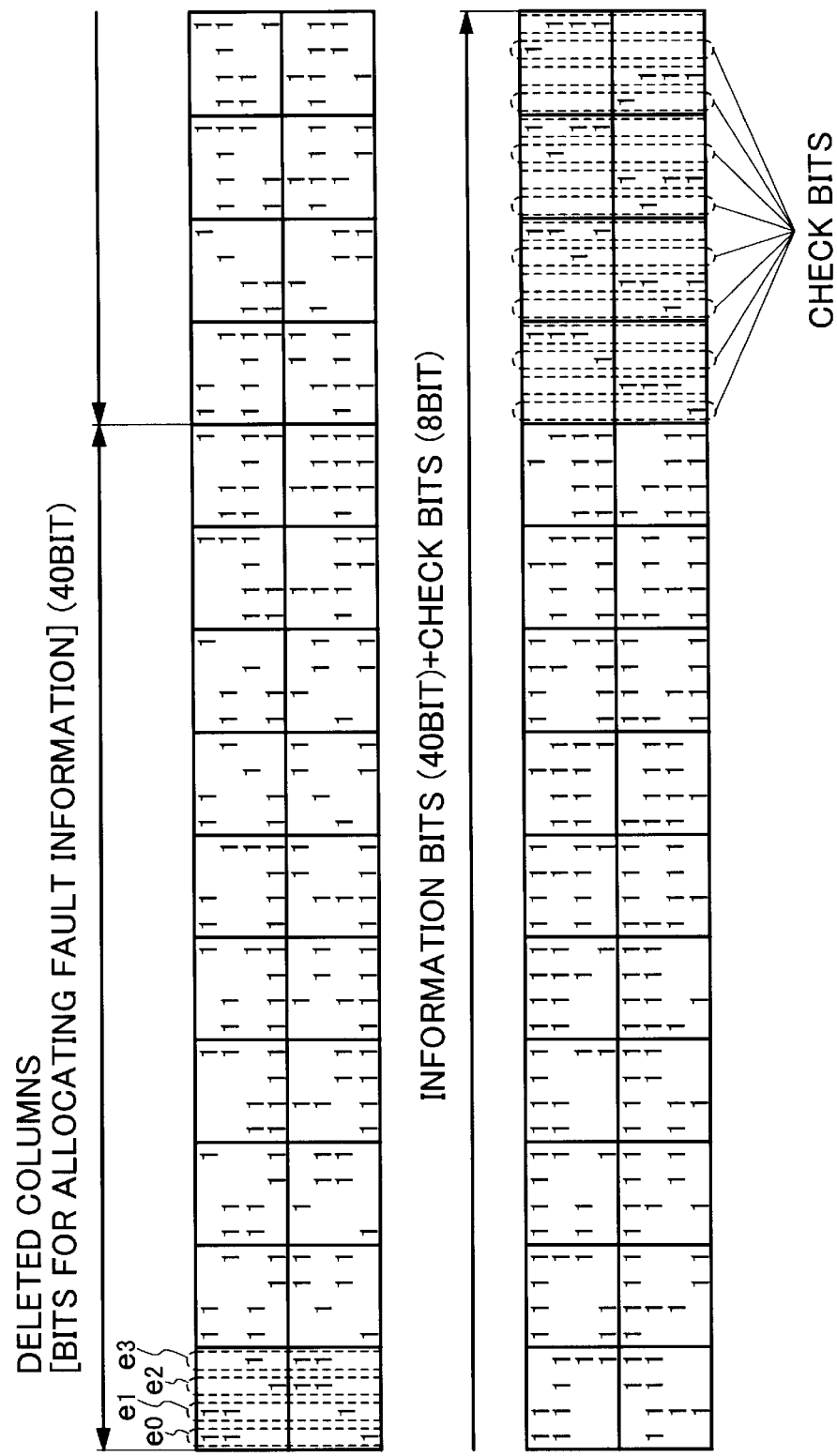
FIG. 8 is an explanatory diagram showing an example of an error control code that is an embodiment of the present invention.

A computer system that adopts a (112, 104) SEC-DED-S4ED (a SEC-DED code capable of detecting a single- to four-bit block error) shown in FIG. 8 as an embodiment of a method in accordance with the present invention will be described with reference to the drawings. The SEC-DED-S4ED code is adopted for many systems in which a data transfer rate at which data is read from a main memory element is four bits, and can detect a failure of a single memory element. For the details of the code, refer to the aforesaid literature (P280-P283). In the present embodiment, a data length employed in the system (a data length actually employed for processing in a CPU) is assumed to be 64 bits. An ordinary error control method other than the method in accordance with the present invention employs a (72, 64) SEC-DED-S4ED code. The method of the present invention is based on the code whose error correcting capacity is a single bit. Therefore, forty bit positions that become available because of employment of a shortened code are used one by one exclusively for fault information, and forty kinds of fault information at most can be encoded. Herein, fault information is allocated to four leading bit positions e0, e1, e2, and e3.

FIG. 9 shows a table listing combinations of fault information and a syndrome. FIG. 9 means that fault information indicating occurrence of an uncorrectable error on a CPU bus is allocated to a bit position e0 in the matrix H shown in FIG. 9. The error control code in accordance with the present invention can be applied to almost all cases. In other words, the error control code can be applied to the single-bit error correcting/double-bit error detecting code (SEC-DED), a code realized by adding another ability to the SEC-DED code, a code having the ability to correct a multi-bit error, and a single-byte error correcting/double-byte error detecting code (SbEC-DbED code) capable of correcting a b-bit (b>1) block (=byte) error. An encoding or decoding procedure is almost the same as the one defined by the conventional error control codes. Consequently, the configuration of a controller need not be modified very largely.

Figure 10:
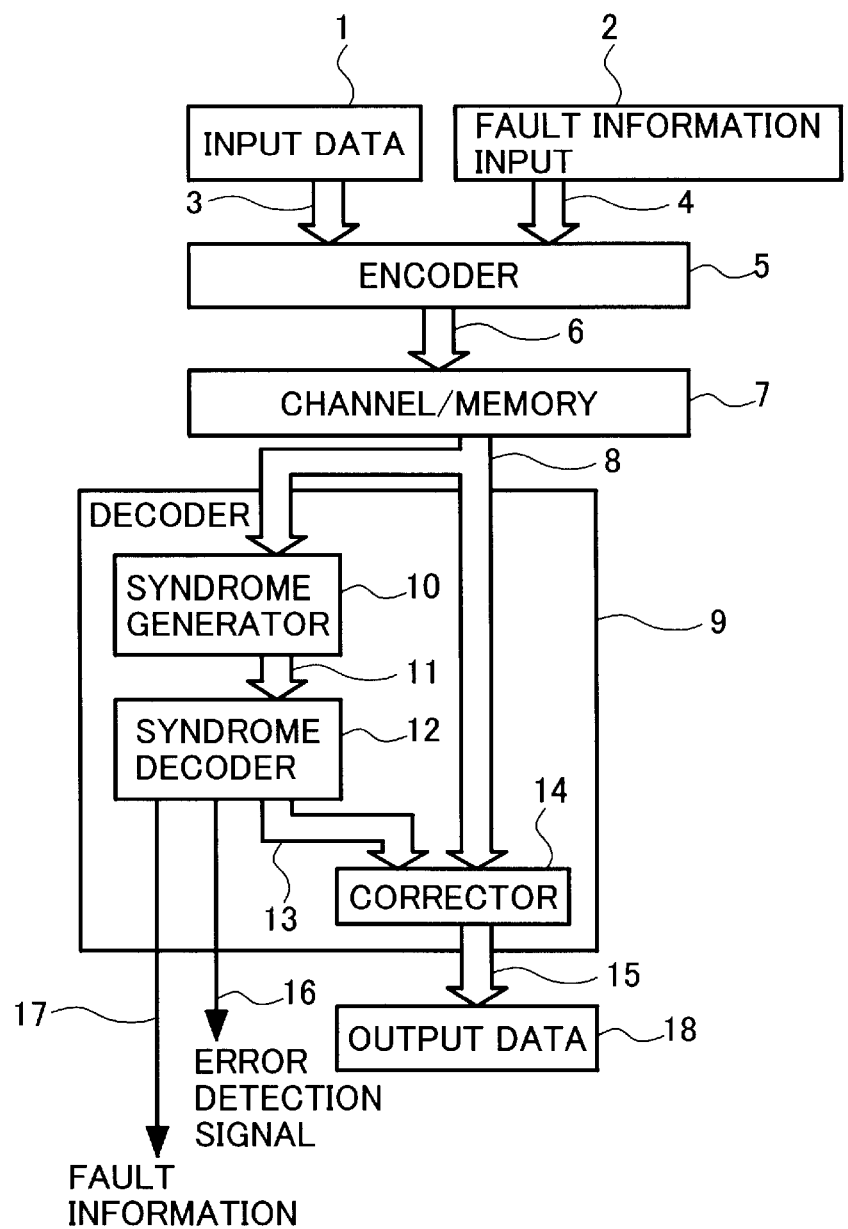
FIG. 10 is a flowchart showing a processing flow defined by an encoding system which is an embodiment of the present invention.

A processing flow defined by the method of the present embodiment will be described in conjunction with FIG. 10. An encoder circuit 5 inputs input data 1 and fault information 2. A decoder circuit 9 inputs an encoded word 8 received over a communication line or from a memory 7, and outputs error-corrected data 15, an error detection signal 16, which indicates that an error is detected, and input data fault information 17. The decoder circuit 9 includes a syndrome production circuit 10, a syndrome decoder circuit 12, and a corrector circuit 14. The syndrome production circuit 10 produces a syndrome from the word 8 received over the communication line or from the memory 7. The syndrome decoder circuit 12 detects the bit position of an error or an uncorrectable error from the syndrome 11, and identifies the fault information 2 that is encoded together with the input data 1. The corrector circuit 14 corrects the error in the word 8 received over the communication line or from the memory according to position information 13 of the error, and outputs corrected data 15.

Figure 11A:
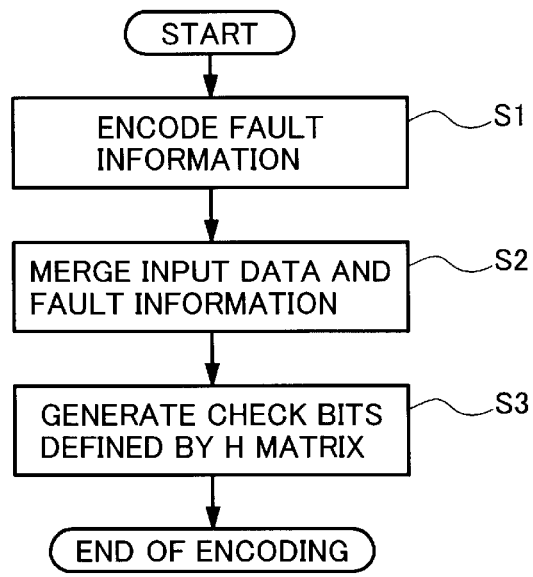
FIG. 11A is flowchart showing an encoding procedure defined in the coding system which is an embodiment of the present invention.
Figure 11B:
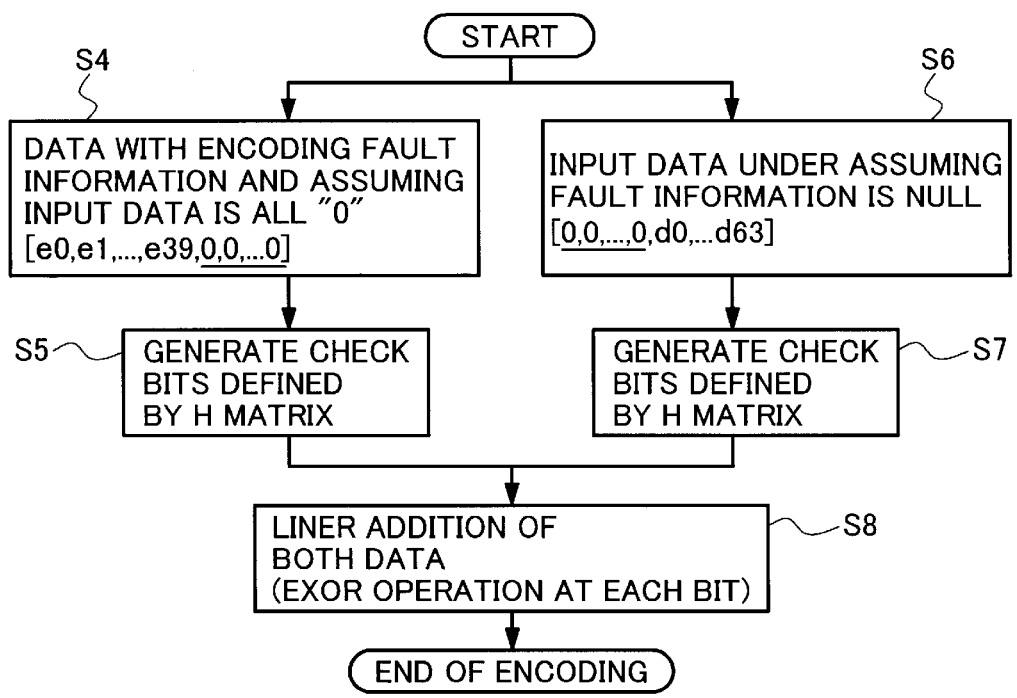
FIG. 11B is flowchart showing an encoding procedure defined in the coding system which is an embodiment of the present invention.

FIG. 11A and FIG. 11B show an encoding procedure. There are two procedures; a first procedure (a) and a second procedure (b). Herein, the matrix H and data structure shown in FIG. 7 are employed. The procedure (a) will be described below. First, fault information appended to data to be encoded is encoded and converted into a bit stream (S1). Thereafter, the input data to be encoded and the fault information are integrated into one data (S2). The matrix H is used to produce check bits (S4). Encoding is thus completed. Next, the procedure (b) will be described. Fault information is encoded, and a word is produced on the assumption that input data exhibits an all-zero bit pattern (S4). Check bits are produced based on the matrix H (S5). Concurrently with steps S4 and S5, a word is produced from input data alone on the assumption that the fault information exhibits an all-zero bit pattern (S6). Check bits are produced based on the matrix H (S7). The check bits produced at steps S5 and S7 are linearly summated (S8). Encoding is thus completed. The second procedure (b) utilizes the fact that the linear sum of words is a word. Steps S6 and S7 in the second procedure (b) correspond to the actions of an existing encoding means, and steps S4 and S5 are additionally included in the second procedure (b).

Figure 12:
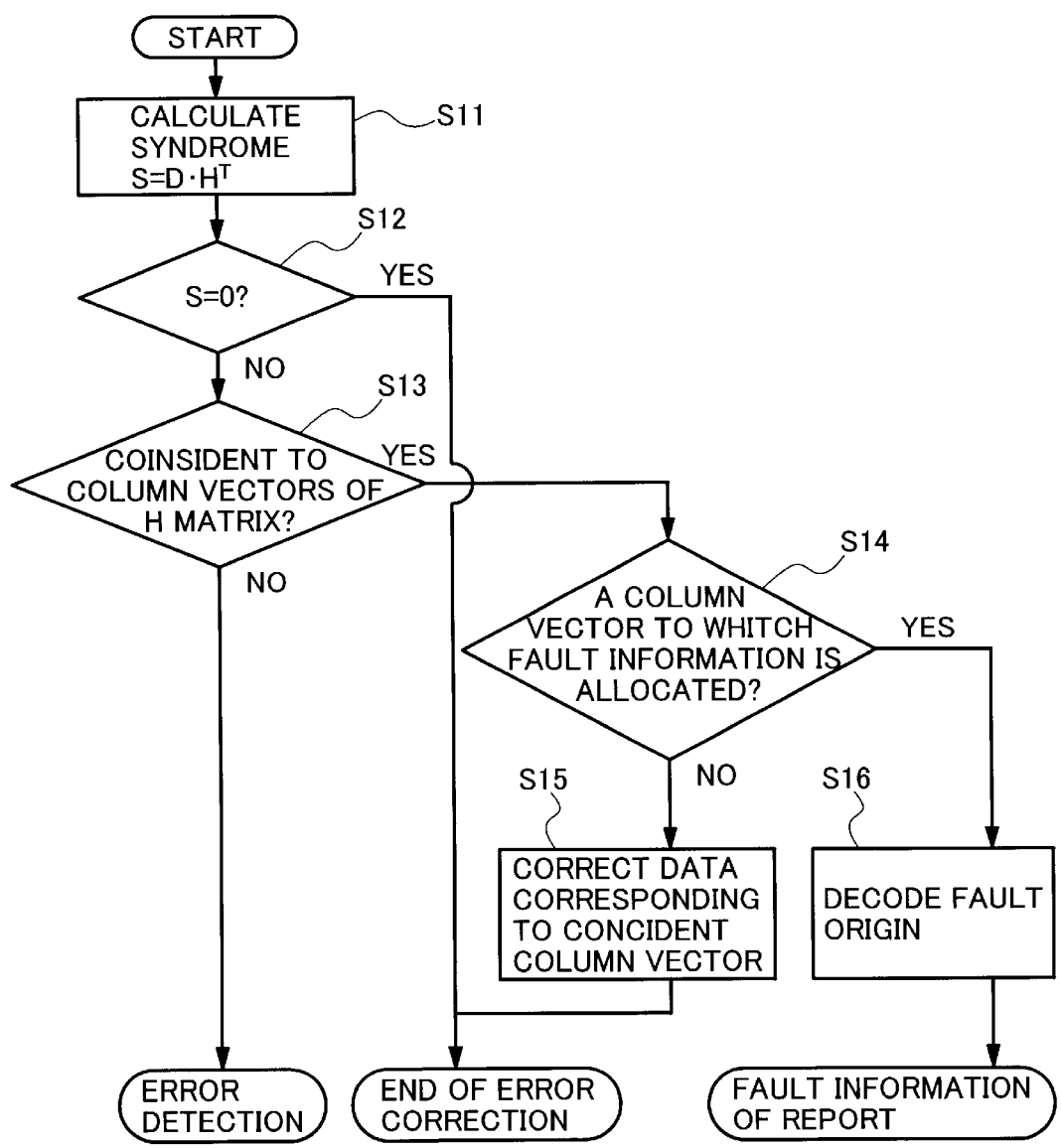
FIG. 12 is a flowchart showing a decoding procedure defined by an encoding system which is an embodiment of the present invention.

FIG. 12 shows a decoding procedure. A product of a word to be decoded by a transposed matrix of the matrix H is calculated to produce a syndrome S (S11). Thereafter, if the syndrome S exhibits an all-zero bit pattern, no error is present. Decoding is therefore terminated. If the syndrome S exhibits a non-zero bit pattern (S12), it is checked if the bit pattern agrees with the bit pattern of any column vector in the matrix H (when a multi-bit error is corrected, it is checked if the bit pattern agrees with the bit pattern of the linear sum of a plurality of column vectors). If the bit pattern does not agree with the bit pattern of any column vector (when a multi-bit error is corrected, if the bit pattern does not agree with the pattern of the linear sum of a plurality of column vectors), an error is detected and decoding is terminated (S13). If the bit pattern agrees with the bit pattern of any column vector, it is checked if the column vector is associated with a bit position to which fault information has been allocated (S14). If the fault information is not present, an error is corrected (S15), and decoding is terminated. If the fault information is present, the cause of the error is decoded by analyzing the bit pattern of the syndrome (S16). The fault information is reported, and decoding is terminated. Furthermore, if a word containing fault information is struck with another error, it is checked at step S13 whether the bit pattern of a syndrome agrees with the bit pattern of any column vector. Consequently, the error can be detected. According to the SEC-DED code or a code having the ability similar to the ability of the SEC-DED code, even if another one-bit error occurs, the one-bit error can be detected together with fault information.

Figure 13:
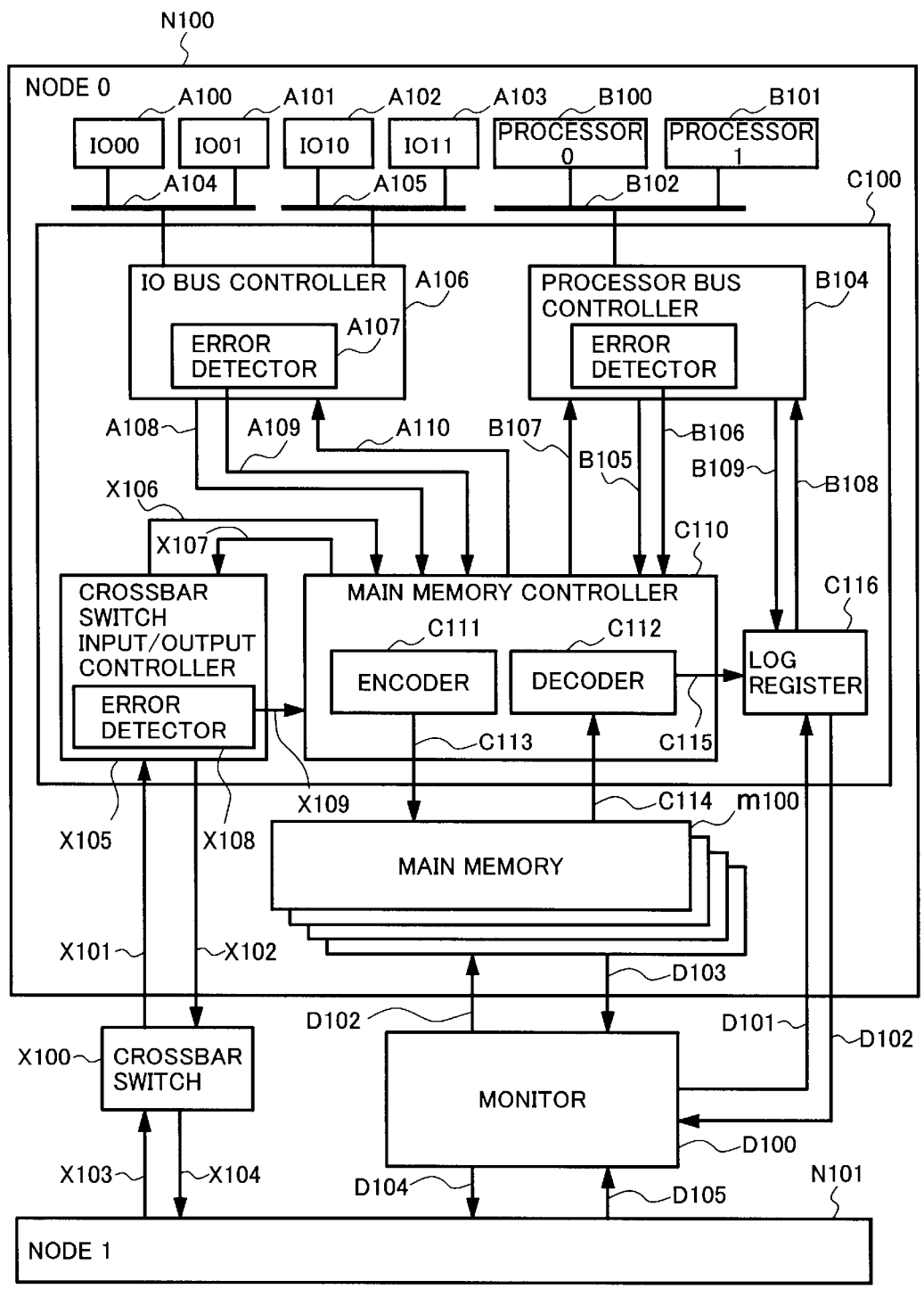
FIG. 13 is a block diagram showing an overall configuration of a computer system which is an embodiment of the present invention.

An example of a computer system in which the present invention is implemented will be described with reference to the drawings. FIG. 13 shows an overall configuration of a computer system in accordance with an embodiment of the present invention. In the computer system, nodes N100 and N101 mutually access resources over signal lines X101, X102, X103, and X104 via a crossbar switch X100. The number of nodes is two in the present embodiment but may be more than two. A plurality of nodes is interconnected with the crossbar switch X100 between them.

The node N100 consists mainly of a main memory controller C100, processors B100 and B101, a processor bus B102, I/O units A100, A101, A102, and A103, I/O buses A104 and A105, and a main memory m100. The numbers of processors, I/O units, processor buses, and I/O buses are not limited to the values specified in the present embodiment. Any numbers of processors, I/O units, processor buses, and I/O buses may be combined. The processors B100 and B101 are connected to the main memory controller C over the processor bus B102. The main memory m100 is connected to the main memory controller C100 over signal lines C113 and C114.

The main memory controller C100 consists mainly of a processor bus control unit B103, an I/O bus control unit A106, a crossbar switch input/output control unit X105, a main memory control unit C110, and a log register C116. The processor bus control unit B103 is connected to the main memory controller C110 over signal lines B105 and B107. The processor bus control unit B103 includes an error detection circuit B104 that detects an error in data that is transferred over the processor bus B102 and written in the main memory. When the error detection circuit B104 detects an uncorrectable error (a parity error when a parity bit is appended, an error of 1 bit or more long when the SEC-DED code is adopted), the fact that an uncorrectable error has occurred is reported to the main memory control unit C110 over a signal line B106 synchronously with transfer of data to be written in the main memory over the signal line B105.

The I/O bus control unit A106 includes an error detection circuit A107 that detects an error in data which is transferred over the I/O buses A104 and A105 and written in the main memory. If the error detection circuit A107 detects an uncorrectable error in data to be written in the main memory, the presence of the uncorrectable error is reported to the main memory control unit C110 over a signal line A109 synchronously with transfer of data, which is written in the main memory, over a signal line A108.

The main memory control unit C110 interprets a writing address of data that is transferred from the processor bus control unit B103 or I/O bus control unit A106 over the signal line B105 or A108. The main memory control unit C110 judges whether the data is addressed to the own node N100 or the other node A101. If the data is address to the other node N101, the data is transferred to the crossbar switch input/output control unit X105 over a signal line X107. The data is then transferred from the crossbar switch input/output control unit X105 to the other node N101 by way of the signal line X102, the crossbar switch X100, and the signal line X104.

The crossbar switch input/output control unit X105 includes an error detection circuit X108 that detects an error in data transferred from the other node N101. If an uncorrectable error occurs, the fact that the uncorrectable error has occurred is reported to the main memory control unit C110 over a signal line X109 synchronously with transfer of data over the signal line X106.

The main memory control unit C110 includes an encoder circuit C111 that encodes data, which is written in the main memory m100, according to the error control code, and a decoder circuit C112 that detects and corrects an error in data read from the main memory m100. Information of an error detected by the decoder circuit C112 or incorrect data is recorded as a log in the log register C116. The log register C116 receives error information from the decoder circuit C112 over a signal line C115. The log register C116 is memory-mapped, and accessed by way of the processor bus B102, processor bus control unit B103, and signal line B109 when an error processing routine is activated in the processor B100 or B101. Data read from the log register C116 is transferred to the processor B100 or B101 by way of the signal line B108, processor bus control unit B103, and processor bus B102.

A monitor D100 is installed outside the nodes N100 and N101. The log register C116 is accessed over a signal line D101, and the contents of the log register C116 are transferred to the monitor D100 over a signal line D102. The contents of the log register are then indicated using a display screen on the monitor D100. The main memories m100 in the nodes are dumped and the dumps are transferred to the monitor D100 over the signal lines D102, D103, D104, and D105.

Figure 14:
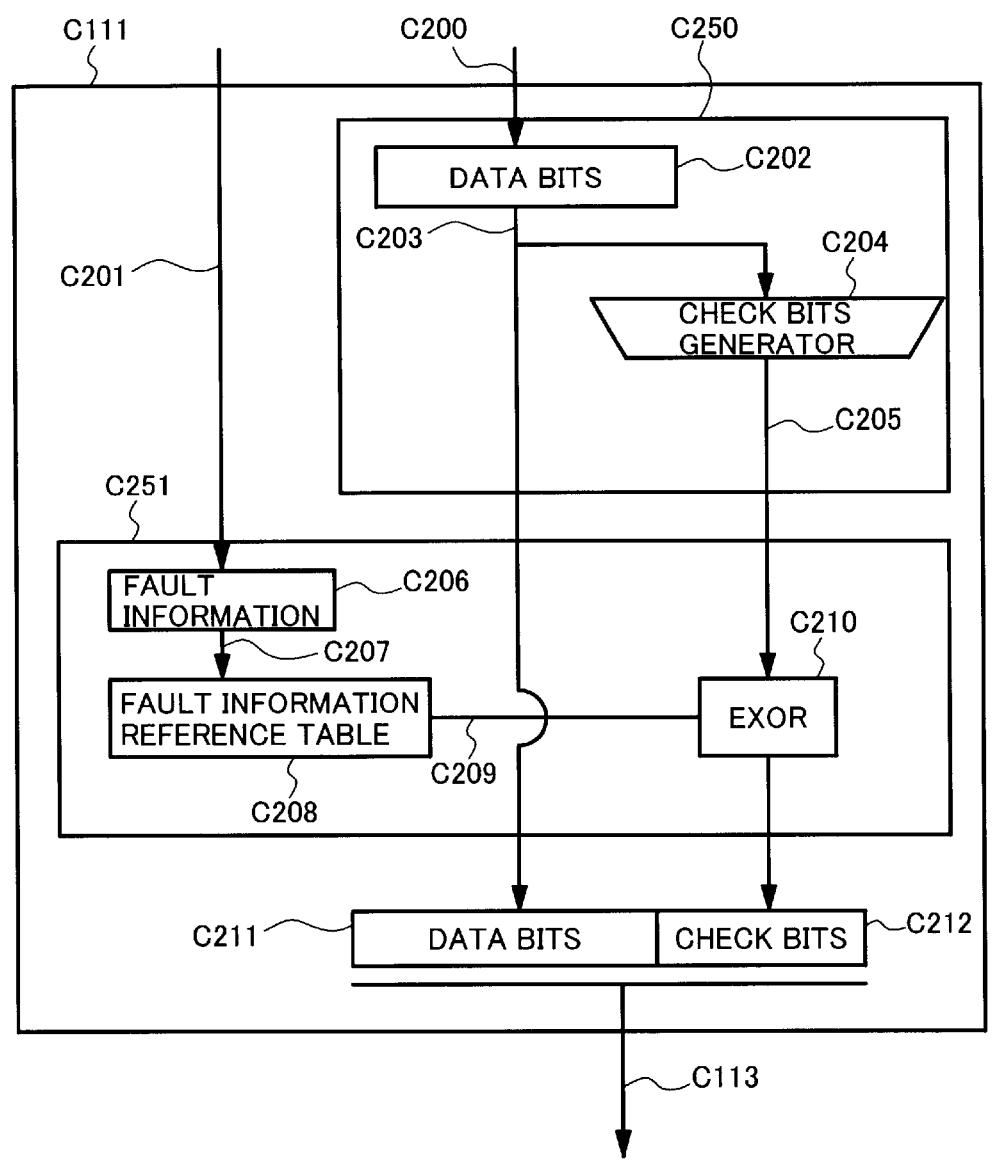
FIG. 14 is a block diagram showing an encoder circuit included in a controller which is an embodiment of the present invention.

The encoder circuit C111 shown in FIG. 14 will be described below. The encoder circuit C111 consists mainly of a register C202, a check bit production circuit C204, a fault information register C206, a fault information detection table C208, an exclusive OR circuit C210, a register C211, and a register C212. Write data to be written in the main memory is held in the register C202. Fault information such as information indicating that an uncorrectable error has been detected in data to be written in the main memory by the processor bus control unit, I/O bus control unit, or crossbar switch input/output control unit, or information indicating the location of an error is held in the fault information register C205. The fault information detection table C208 is used to produce a check bit pattern according to fault information. The exclusive OR circuit C210 produces a linear sum of check bit patterns. A data to be written in the main memory is held in the register C211. Check bits are held in the register C212. A circuit C250 is identical to a conventional check bit production circuit. The addition of a circuit C251 to the circuit C250 enables implementation of the encoding method proposed in the present invention. The circuit C250 carries out the second procedure (b) described in FIG. 11B. The circuit C250 shown in FIG. 14 carries out steps S6 and S7, and the circuit C251 shown therein carries out steps S4 and S5 in the second procedure (b) described in FIG. 11B.

The actions of the encoder circuit C111 will be described below. The encoder circuit C111 carries out the second procedure (b) described in FIG. 11B. Referring to FIG. 13, a selector included in the main control unit C110 selects either of write data transferred from the processor bus control unit B103, I/O bus control unit A106, or crossbar input/output control unit X105 to the main memory control unit C110, and information indicating that an uncorrectable error has occurred. The selected write data or information is transferred to the encoder circuit C111 over a signal line C200 or C201 shown in FIG. 14. The write data is transferred from the register C202 to the check bit production circuit C204 over a signal line C203. The check bit production circuit C204 then produces check bits, and the check bits are transferred to the exclusive OR circuit C210 over a signal line C205. On the other hand, the uncorrectable error information and a signal indicating the location of a detected error are held in the fault information register C206 over the signal line C201, and transferred to the fault information detection table C208 over a signal line C207. An association circuit equivalent to the table shown in FIG. 9 is included as the fault information detection table C208. A bit pattern of a syndrome associated with a kind of fault is retrieved from the fault information detection table C208. The bit pattern of a syndrome is equivalent to a check bit pattern produced during encoding.

The check bit pattern retrieved from the fault information detection table C208 is transferred to the exclusive OR circuit C210 over a signal line C209, and treated at step S8 in the second procedure. A completed word is held in the registers C211 and C212, and transferred to the main memory over the signal line C113.

Next, the decoder circuit C112 shown in FIG. 15 will be described below. The decoder circuit C112 includes an information bit register C300, a check bit register C301, a syndrome production circuit C304, a syndrome decoder circuit C306, an error corrector C308, a fault information detection table C351, an information bit register C310, and a check bit register C311.

The actions of the decoder circuit C112 will be described below. The decoder circuit C112 carries out the procedure described in FIG. 12. Referring to FIG. 15, data read from the main memory is held in the information bit register C300 and check bit register C301 over a signal line C114. The data is then transferred from the registers C300 and C301 to the syndrome production circuit C304 over a signal line C303. A syndrome is then produced. The production of a syndrome is described as step S11 in FIG. 12 similarly to that to be performed according to the conventional error control method. The produced syndrome is transferred to the syndrome decoder circuit C306 over a signal line C305. If the syndrome exhibits an all-zero bit pattern, it is judged that no error is present. Otherwise, error correction or error detection is performed as steps S13 and S15 described in FIG. 12. The processing is equivalent to conventional error detection or correction. The syndrome is decoded. A signal representing a pointer that points out an error is transferred to the error corrector C308 over the signal line C307. A bit at a position pointed out by an error pointer contained in data that is read from the main memory and transferred over the signal line C303 is inverted. The error-corrected data is held in the registers C310 and C311, and transferred over a signal line C312. The data on the signal line C312 is transferred to the processor bus control unit, I/O bus control unit, or crossbar switch input/output control unit that has requested the main memory control unit C110 shown in FIG. 13 to read data from the main memory.

Figure 15:
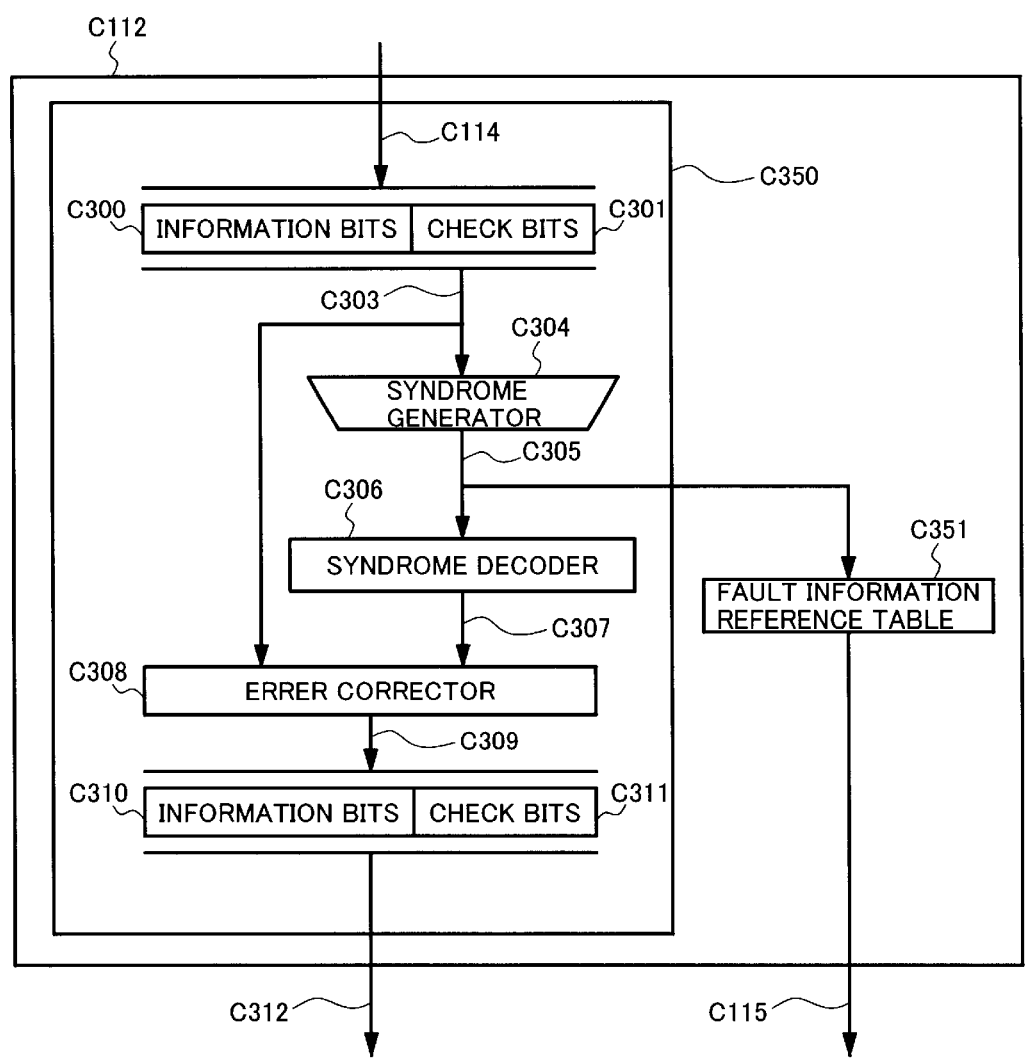
FIG. 15 is a block diagram showing a decoder circuit included in s controller which is an embodiment of the present invention.

The actions of a circuit C350 in FIG. 15 are identical to those of a conventional error detection and correction circuit. A constituent feature of the present invention is the fault information detection table C351. The fault information detection table C351 is a circuit for interpreting fault information appended to data from the bit pattern of the syndrome transferred over the signal line C305. The action of the fault information detection table C351 is described as step S16 in FIG. 12. Namely, as already described, a kind of fault associated with a syndrome is retrieved from the table shown in FIG. 9. The interpreted fault information is transferred to the log register C116 shown in FIG. 13 over the signal line C115 shown in FIG. 15.

In the present embodiment, data transferred over the processor bus and the data buses in the main memory and main memory controller is protected according to the same error control code. In particular, the processors include an error detection and correction circuit. The circuit has the same circuitry as the circuit C250 in FIG. 14 or as the circuit C350 in FIG. 15.

If data is struck with a multi-bit error that cannot be treated with the correcting ability of the error control code (except when data contains fault information), an output C312 of the decoder circuit C112 is applied again to an input terminal C200 of the encoder circuit C111, though this pass is not illustrated. Fault information is then appended to the data, and the data is encoded. The resultant data is transferred to the processor bus control circuit. If data read from the main memory has fault information appended thereto, the data is transferred to the processor control circuit as it is.

The processor receives data, which is encoded together with fault information, from the main memory over the processor bus. A decoder circuit in the processor decodes the data. The matrix H to which the fault information is allocated has a small number of column vectors. Besides, a syndrome exhibits a non-zero bit pattern. Therefore, an error is treated as an uncorrectable error but not as a correctable error. According to the present invention, even if a conventional error detection and correction circuit (C251 shown in FIG. 14 and C351 shown in FIG. 15) to which a circuit for implementing the method of the present invention is not added is included, data having fault information appended thereto is treated as data struck with an uncorrectable error. The method in accordance with the present invention can be said to be a lower-level compatible method enabling a lower-level computer system to treat an error properly. When the processor decodes the data that is read from the main memory and has fault information appended thereto, an uncorrectable error occurs, and an error interrupt is issued. The processor then carries out an error processing routine. When the processing of reading data from the log register C116 shown in FIG. 13 is added to the error processing routine, the I/O bus that is faulty can be disconnected in order to enable graceful degradation of the computer system. Moreover, when the contents of the log register are indicated as the location of an error using a display screen, a faulty component can be identified immediately. The main memory may be dumped during the error processing routine, and the dump may be indicated using a display screen. In this case, the contents of the main memory may be subjected to the method in accordance with the present invention under control of the BIOS or any other software, and the location of an error may be indicated using a display screen.

Even when data to be written in the main memory is struck with an uncorrectable error, if the data is unused by the processor, a fault in the processor does not come to light. The operating ratio of the computer system can be improved. Moreover, even if an uncorrectable error is detected in the processor as mentioned above, only the procedure of reading the error-stricken data can be suspended. The probability of a system failure can be minimized.

Moreover, the monitor D100 shown in FIG. 13 may be activated while the computer system is in operation or any action is suspended. The main memory may then be dumped, and fault information may be decoded by software and indicated using a screen display. Moreover, the contents of the log register may be indicated. Consequently, a faulty component or a source of an error can be located immediately.

When the computer system shown in FIG. 13 is activated under control of a specified operating system, the components of the computer system, or especially, the encoder circuit and decoder circuit may be described in the operating system program. The operating system program is loaded into the main memory m100 when, for example, the computer system is started up.

The present invention made by the present inventor has been described by taking the embodiment for instance. The present invention is not limited to the embodiment. Needless to say, as long as the gist of the present invention will not be altered, the present invention can be modified in various aspects.

The advantages provided by a typical aspect of the present invention disclosed in this application will be briefed below.

The present invention is concerned with an error detection and correction method for information communication systems adopting error detection codes or memory systems. According to the method, data having fault information appended thereto can be encoded without any change in a data length. Moreover, even when a decoding method to which the method is not added is adopted, error-stricken data can be identified and an error will not be corrected wrongly. In a computer system in which the method is implemented, only a procedure of reading error-stricken data is subjected to an error procedure. Consequently, the operating ratio of the system can be improved with a system failure suppressed to the greatest possible extent. Moreover, a speed at which the source of an error is specified can be improved, and a system failure time can be minimized.

What is claimed is:

1. A main memory controller connected to a processor through a processor bus, connected to an I/O unit through an I/O bus, and designed to control writing or reading of a main memory, said main memory controller comprising:

a first error detection circuit for detecting an error in data on said processor bus;

a second error detection circuit for detecting an error in data on said I/O bus:

an encoder circuit for producing check bits using object data to be written, which is transferred over one of said processor bus and I/O bus and written in said main memory, and fault information bits which, when one of said first and second error detection circuit detects an uncorrectable error in the object data, enable identification of a detection circuit which detects the uncorrectable error, and for producing a word composed of the object data to be written and the check bits as a word to be written in said main memory;

a decoder circuit for producing a syndrome for data read from said main memory under an assumption that the unwritten fault information bits were all zero, and detecting and correcting an error in the object data according to a bit pattern of the syndrome; and a fault information detection table for detecting whether the syndrome produced by said decoder circuit exhibits a specific bit pattern so as to identify the source of an uncorrectable error having occurred before encoding is performed by said encoder circuit.

2. A main memory controller according to claim 1, wherein said main memory controller is connected to another main memory controller via a crossbar switch, and further comprises a third error detection circuit for detecting an error in data transferred via said crossbar switch; and said third error detection circuit is included in the detection circuits to be identified based on the fault information.

3. A main memory controller according to claim 1, wherein said encoder circuit adopts a SEC-DED code to produce the check bits such that: specific bit positions among a plurality of bit positions which are associated with column vectors of a parity check matrix defined in the SEC-DED code are allocated to the fault information bits; and said decoder circuit indicates that the read-out data is struck with a two-bit error when the produced syndrome is neither all zero nor any one of said column vectors of the parity check matrix.

4. A main memory controller according to claim 1, wherein as a coding system implemented in said encoder circuit, a SbEC-DbED code according to which an error is controlled in units of a b-bit byte (b>2) is adopted to produce a shortened word; specific bit positions among a plurality of bit positions which are associated with column vectors deleted from a parity check matrix defined in the SbEC-DbED code are allocated to fault information indicating that an uncorrectable error has been detected in data transferred over one of said processor bus and I/O bus; said decoder circuit decodes data on the assumption that the fault information represents bits of 0s; when data transferred over one of said processor bus and I/O bus and struck with an error is decoded, a one-byte error indicated with the fault information is detected and corrected; and when the corrected word having a bit of 1 contained in fault information thereof is struck with another one-byte error, the error is detected.

5. A main memory controller according to claim 1, further comprising a register in which information of an error detected by one of said decoder circuit and error-stricken data is held as a log, and a monitor used to indicate the contents of the register.

6. A computer-usable storage medium in which a program having the following steps is stored:
  encoding fault information showing one of presence and absence of fault on object data to be transferred to one of the memory and the communication line into fault information bits;
  producing an encoded word which is composed of said fault information bits, said object data and check bits generated from said fault information bits and said object data according to a c-bit error correcting/d-bit error detecting code,
  transferring a shortened code obtained by removing said fault information bits from said encoded word to one of a memory and a communication line;
  receiving the shortened code from the one of the memory and the communication line; and
  conducting an error detecting/correcting process on the received code according to a bit pattern of a syndrome produced from the received code under an assumption that the removed fault information bits were all zero to reproduce said fault information bits and said object data.

7. An error detection and correction method for one of a memory and a communication line employing a c-bit error correcting/d-bit error detecting code (d>c), said error detection and correction method comprising the steps of:
  encoding fault information showing one of presence and absence of fault on object data to be transferred to one of the memory and the communication line into fault information bits;
  producing an encoded word which is composed of said fault information bits, said objected data and check bits generated from said fault information bits and said object data according to the c-bit error correcting/d-bit error detecting code,
  transferring a shortened code obtained by removing said fault information bits from said encoded word to one of the memory and the communication line;
  receiving the shortened code from one of the memory and the communication line;
  interpolating the removed bits of the received code with a fixed value; and
  conducting an error detecting/correcting process on the interpolated received code according to a bit pattern of a syndrome produced from the interpolated received code to reproduce said fault information bits and said object data.

8. An error detection and correction method for one of a memory and a communication line employing a c-bit error correcting/d-bit error detecting code (d>c), said error detection and correction method comprising steps of:
  encoding fault information showing one of presence and absence of fault on object data to be transferred to one of the memory and the communication line into fault information bits;
  producing an encoded word which is composed of said fault information bits, said objected data and check bits generated from said fault information bits and said object data according to the c-bit error correcting/d-bit error detecting code,
  transferring a shortened code obtained by removing said fault information bits from said encoded word to one of the memory and the communication line;
  receiving the shortened code from one of the memory and the communication line; and
  conducting an error detecting/correcting process on the received code according to a bit pattern of a syndrome produced from the received code under an assumption that the removed fault information bits were all zero to reproduce said fault information bits and said object data.

9. An error detection and correction method according to claim 8 wherein, each of said fault information bits is allocated to indicate individual cause of fault.

* * * * *